Aug. 12, 1969 F. BARSON ET AL 3,461,360

SEMICONDUCTOR DEVICES WITH CUP-SHAPED REGIONS

Filed June 30, 1965 2 Sheets-Sheet 1

INVENTORS
FRED BARSON
HERBERT S. LEHMAN

BY Harry M Weiss
ATTORNEY

United States Patent Office
3,461,360
Patented Aug. 12, 1969

3,461,360
SEMICONDUCTOR DEVICES WITH CUP-SHAPED REGIONS

Fred Barson, Wappingers Falls, and Herbert S. Lehman, Poughkeepsie, N.Y., assignors to International Business Machines Corporation, Armonk, N.Y., a corporation of New York Filed June 30, 1965, Ser. No. 468,235
Int. Cl. H01l *11/00*
U.S. Cl. 317—235 8 Claims

ABSTRACT OF THE DISCLOSURE

A semiconductor device utilizes the formation of a substantially cup-shaped region of one conductivity type between two regions of opposite conductivity type to preferably form a field effect transistor device. The cup-shaped region is preferably formed through one opening in an insulating layer located on the surface of the device. Two successive diffusion operations of opposite conductivity type through the same opening in the insulating layer form the cup-shaped region to the thickness desired.

This invention is directed generally to semiconductor devices including fabrication methods therefor and, more particularly, to insulated gate field effect transistors including fabrication methods therefor.

In the past, field effect transistors were generally fabricated by the technique of forming two spaced regions of the same conductivity type at the surface of a semiconductor wafer of the opposite conductivity type. A control or gate electrode was placed over the area between the two, spaced regions and electrically insulated therefrom so as to permit a potential applied to the gate electrode to either form an electrically conductive channel between the two spaced regions (normally off device) or to remove an existing channel between the two spaced regions (normally on device).

Heretofor, photolithographic masking and etching techniques were used to form two spaced windows in an insulating layer on the surface of the semiconductor wafer through which the two spaced regions of semiconductor material of a conductivity type opposite from the conductivity type of the wafer were formed on the surface of the wafer by a diffusion operation. One disadvantage with this fabrication technique is the difficulty in uniformly manufacturing simultaneously a multiplicity of field effect transistor devices each having the same precise dimensions including channel width and uniform electrical characteristics. During the diffusion operation, the impurity atoms pass directly through the two windows into the semiconductor wafer and disperse in every direction thereby making it difficult to form two well defined spaced regions of the same type conductivity including a uniform separation or channel width between the regions. Another disadvantage of this prior art technique for fabricating field effect transistors is that the separation between the two regions was limited to a minimum width of approximately a few tenths of a mil.

Consequently, it was desirable to devise a technique for manufacturing a multiplicity of field effect transistors (FET) with each FET having uniform electrical characteristics and separation width between the two regions of the same conductivity type. In addition, the separation, width had to be much smaller than prior art FET structures and desirably be on the order of hundredths of a mil thereby permitting the application of a very small potential to the control or gate electrode of the FET to change an on device to an off device or vice versa. Furthermore, the FET fabrication method had to permit simultaneous manufacture of both on and off devices in a single semiconductor wafer and, if desired, permit utilization of the fabricated device as either a FET or conventional transistor.

Accordingly, it is an object of this invention to provide an improved semiconductor device.

It is another object of this invention to provide an improved field effect transistor.

It is still another object of this invention to provide an improved method for making a semiconductor device.

It is a further object of this invention to provide an improved method for making a field effect transistor.

It is another object of this invention to provide a semiconductor device which can be operated as either a field effect transistor or a conventional transistor.

It is still another object of this invention to provide a method for fabricating a semiconductor device useful as either a field effect transistor or as a conventional transistor.

It is another object of this invention to provide a method for fabricating both normally on and normally off FET devices simultaneously in a single semiconductor wafer.

It is a still further object of this invention to provide a semiconductor device arrangement which includes both normally on and normally off FET devices in a single semiconductor wafer.

In accordance with a particular form of the invention, the field effect transistor comprises a first region of semiconductor material of one conductivity type provided in a semiconductor wafer. A second region of semiconductor material of the same conductivity as the conductivity type of the first region is also provided in the same wafer. A substantially cup-shaped region of semiconductor material of the opposite type conductivity from the conductivity type of the first and second regions is located between the first and second regions. The cup-shaped region of semiconductor material has a portion extending towards the semiconductor surface. First and second electrodes are respectively connected to the first and second regions thereby functioning as source and drain electrodes. A control or gate electrode electrically insulated from the surface of the semiconductor wafer is positioned over the portion of the cup-shaped region extending toward the semiconductor surface. With this arrangement, a small potential applied to the gate electrode can either form or remove a conductive channel across the surface portion of the portion of the cup-shaped region extending toward the semiconductor surface which is between the two regions of the same type conductivity.

Also in accordance with a particular form of the invention, the method of fabricating a field effect transistor comprises forming through one opening in an insulating layer a substantially cup-shaped region of semiconductor material having one type of conductivity between two regions of semiconductor material having the opposite type conductivity. The cup-shaped region of semiconductor material has a portion extending toward the surface of the semiconductor material. Electrodes are provided for each of the regions of semiconductor material including a control electrode that is electrically insulated from the surface of the semiconductor material and positoned over the portion of the cup-shaped region that extends toward the surface of the semiconductor material.

The foregoing and other objects, features and advantages of the invention will be apparent from the following more particular description of the preferred embodiment of the invention as illustrated in the accompanying drawings.

Figure 1:
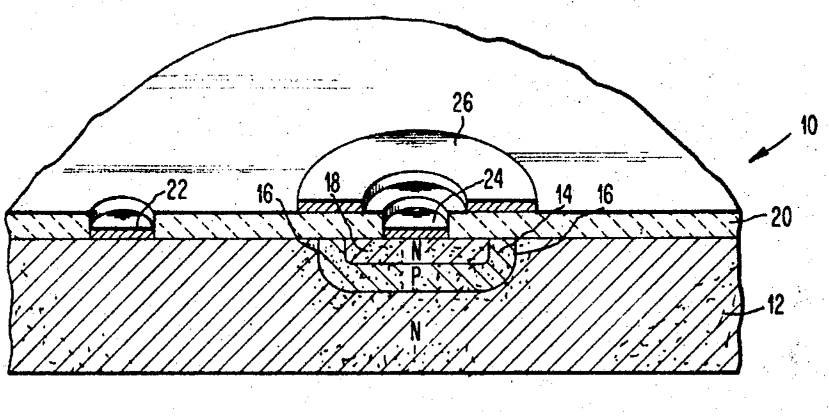
FIG. 1 is a perspective view partially in cross section of the field effect transistor of this invention in an off condition.

Referring to FIG. 1 a field effect transistor is generally designated by reference numeral 10. The field effect transistor 10 comprises a region 12 of semiconductor material of one type connductivity. The region 12 can be of P or N type conductivity, however, in the embodiment shown in FIG. 1, the region 12 is of N type conductivity that has been formed by preferably doping a silicon wafer with phosphorous impurity atoms. The formation of the suitably doped silicon wafer can be either by epitaxial growth of the desired conductivity type monocrystalline semiconductor material or by suitably growing a bar of monocrystalline silicon from a monocrystalline seed using a melt that has been doped with the desired amounts of the impurity atoms and then slicing the bar into wafers having the desired thickness.

After the semiconductor wafer has been formed into the dimensions desired, a substantially cup-shaped region 14 is formed in the region 12. The cup-shaped region 14 has a conductivity opposite to the conductivity of the region 12 and, in addition, the cup-shaped region 14 has a portion 16 extending toward the surface of the semiconductor wafer. A second region 18 of the same conductivity type as the region 12 is also provided in the semiconductor wafer.

The cup-shaped region 14 and the region 18 of semiconductor material can be formed by the process of opening a small window in an insulating layer 20 formed on the surface of the semiconductor material and serving as a diffusion mask. Two diffusion operations are then carried out with the first diffusion being with impurity atoms of boron to form the P region 14 and the subsequent diffusion being with phosphorous atoms to form the N region 18 and also provide the region 14 with a substantially cup-shaped configuration. The resulting structure is somewhat similar to the conventional planar transistor device currently being used in many circuit applications except that both diffusions for forming the regions 14 and 18 are carried out through a single window or opening in the masking layer 20.

Figure 4:
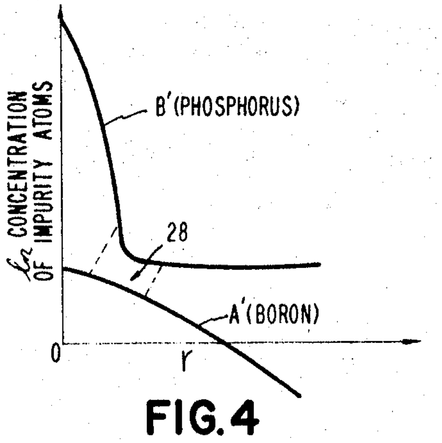
FIG. 4 is a graph similar to FIG. 3 showing the concentrations of boron and phosphorous impurity atoms along the surface of the field effect transistor of FIG. 2 indicating the existence of a channel between the two regions of the same type conductivity.

In one example for fabricating a normally on field effect transistor, the resistivity in ohm-centimeters of the silicon region 12 was preferably in the range of 0.5 to 6.0 ohm-cm. The boron diffusion to form the region 14 had a surface concentration of $2\times10^{17}$ atoms per cubic centimeter and a junction depth of 0.25 mils. The phosphorous diffusion to form the region 18 while simultaneously forming region 14 into a substantially saucer or cup-shaped configuration had a surface concentration of about $2\times10^{21}$ atoms per cubic centimeter and a junction depth of 0.10 mils. As indicated by the graph of FIG. 4 the formed channel has a width on the order of several hundredths of a mil or less than one tenth of a mil. The $SiO_2$ layer 20 was about 3,000 angstroms thick. In fabricating a normally off field effect transistor, the boron surface concentration would be slightly higher and/or the boron junction depth would be slightly greater.

An additional technique for forming the regions 14 and 18 would be to etch out a recess in the desired region 12 of semiconductor material and subsequently epitaxially deposit regions of monocrystalline semiconductor material of opposite type conductivities to form the regions 14 and 18. U.S. Patent application Ser. No. 454,257, filed May 10, 1965, entitled, "Semiconductor Device Arrangement and Fabrication Method Therefor," whose inventors are V. Y. Doo and J. Regh is herewith incorporated by reference to show the etch-regrowth technique that is described above.

A drain electrode 22 was provided by forming an ohmic contact with the semiconductor region 12 and similarly, a source electrode 24 was provided by forming an ohmic contact to the semiconductor region 18. This arrangement permits the device 10 to be used with higher voltages than reversing the source and drain electrodes. However, in some applications the source and drain electrodes can be reversed, if desired. Each of the electrodes 22 and 24 can be formed after openings have been made in the insulating layer 20 which is preferably of $SiO_2$ that has been grown on the surface of the semiconductor wafer by conventional thermal oxidation technique. A control electrode 26 preferably toroidal in configuration is deposited on the insulating layer 20 over the portion 16 of the cup-shaped region 14 that extends towards the surface of the semiconductor wafer.

All of the electrodes including the control or gate electrode 26 can be of molybdenum or any desired metal. In the case of the gate electrode 26 being made of aluminum or some of the other active metals as defined in the copending patent application Ser. No. 468,225 of Herbert Lehman filed concurrently herewith filed June 30, 1965 and assigned to the same assignee of this invention and entitled, "Method for Controlling the Electrical Characteristics of a Semiconductor Surface," the active gate electrodes can, by suitable heat treatment thereof, create an inversion layer or conductive channel across the portion 16 of the cup-shaped region 14 so as to electrically connect up the regions 12 and 18 of the same type semiconductor material thereby providing a normally on field effect transistor. Similarly, heat treatment of the gate electrode 26 can provide normally off field effect transistor devices by removing the conductive channels in accordance with the teachings of the Lehman application.

Figure 2:
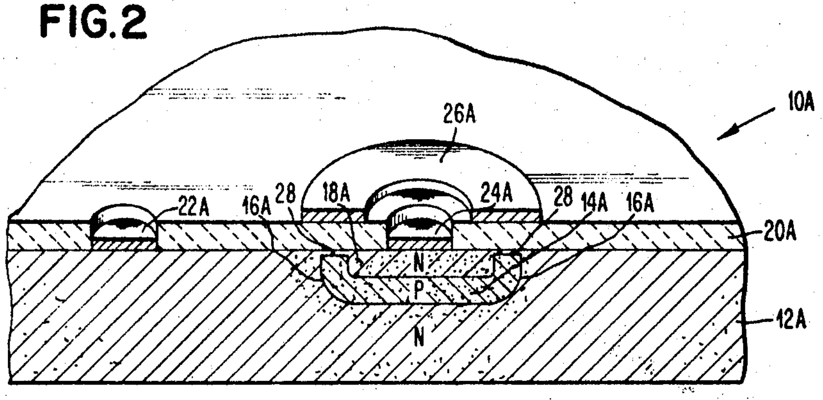
FIG. 2 is a perspective view partially in cross section of the field effect transistor of this invention in an on condition.

Referring to FIG. 2, similar reference numbers are used to designate the corresponding elements in FIG. 1 with the addition of the letter A to designate the embodiment of FIG. 2. A channel 28 is formed along the surface of the portion 16 of the cup-shaped region 14 so as to electrically interconnect the two regions 12A and 18A of the same type conductivity. The formation or removal of the toroidal channel 28, which provides respectively on or off field effect transistor devices, can be created by applying a potential to the gate electrode 26A. With heat treatment of the gate electrode 26A in accordance with the teachings of the Herbert Lehman application, normally on devices can be transformed into normally off devices or vice versa.

By carrying out two separate diffusions through a single window a very narrow, precisely controlled, channel or separation width can be formed for the portion 16 or 16A of the region 14 or 14A of FIGS. 1 or 2 respectively. This diffusion operation is only dependent on the relative depth of diffusion and is independent of wafer thickness, photolithographic techniques, etc. Consequently, the relative concentration of the impurity atoms of boron and phosphorous help control the conductive channel 28 formed across toroidal portion 16A. In carrying out the thermal oxidation step wherein the silicon semiconductor wafer is thermally oxidized within the range of 950° to 1,000° C. preferably in a steam atmosphere, the phosphorous atoms are rejected by the silicon dioxide layer 20A while the boron atoms diffuse into the the $SiO_2$ layer 20A. This occurs when relatively fast oxide growth rates and low growth temperatures are used as taught by M. M. Atalla and E. Tannenbaum, Bell System Technical Journal, volume 39, p. 933 in the 1960 edition. Consequently, due to the existence of both types of impurity atoms at the surface of the semiconductor wafer and since one of the types of impurity atoms becomes diffused into the $SiO_2$ layer and the other of the types of impurity atoms accumulates or piles up at the surface of the semiconductor wafer, the conductive channel 28 is formed of N type conductivity across the portion 16A of the cup-shaped region 14A. Hence, formation of the channel 28 is dependent on the initial relative concentrations of both types of impurity atoms at the surface of the semiconductor wafer and also on the conditions of growth of the $SiO_2$ layer 20A which controls both the amount of impurity atoms of one type which will pile up at the surface of the semiconductor wafer and the impurity atoms of the other type which will be absorbed into the $SiO_2$ layer 20A thereby varying the final surface concentration of both types of impurities. Therefore, the surface of the portion 16A of the cup-shaped region 14A, which was previously of P type conductivity due to the existence of a greater quantity of P type impurity atoms than N type impurity atoms, changes from its original P type conductivity to N type conductivity due to the consequent absorption of P type impurity atoms into the layer 20A upon reoxidation thereof thereby leaving the surface of the surface portion 16A with a greater quantity of N type impurity atoms.

Figure 3:
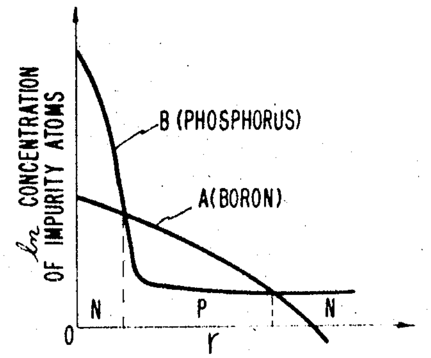
FIG. 3 is a graph showing the respective concentrations of boron and phosphorous impurity atoms radially along the surface of the field effect transistor of FIG. 1 with the origin taken at the edge of the window through which the impurity atoms were diffused.

Referring to FIG. 3, a graph is shown with the ordinate axis being the logarithm of concentration of impurity atoms and the abscissa axis being the radial distance taken from the origin which is at the edge of the window through which the diffusions are made. Curve A depicts the radial concentration of boron impurity atoms for the normally off field effect transistor of FIG. 1 and curve B shows the radial concentration of phosphorous impurity atoms. The N, P, N regions are noted on the abscissa axis showing the relative concentrations of both types of impurity atoms in each region. Accordingly, it is apparent that the concentrations of both types of impurity atoms are such as to indicate that each N, P, N region is specifically set out and hence, no channel exists across the portion 16 of the cup-shaped region 14 along the surface in contact with the insulating layer 20.

Referring to FIG. 4 which is a graph similar to the graph of FIG. 3, curve A′ depicts the concentration of boron impurity atoms after the reoxidation of the semiconductor surface and curve B′ depicts the concentration of the phosphorous impurity atoms. As a result of the reoxidation of the semiconductor surface with the diffusion of boron atoms into the oxide layer 20A and the pile up of phosphorous atoms, it can be seen from FIG. 4 that both curves A′ and B′ have shifted with respect to their relative positions in FIG. 3 thereby leaving the channel 28 designated as the area formed by the lines between the curves A′ and B′. Consequently, it is seen that the channel 28 across the surface portion of the portion 16A of the cup-shaped region 14A is of N type conductivity due to the relatively larger amount of phosphorous impurity atoms than boron impurity atoms.

Figure 5:
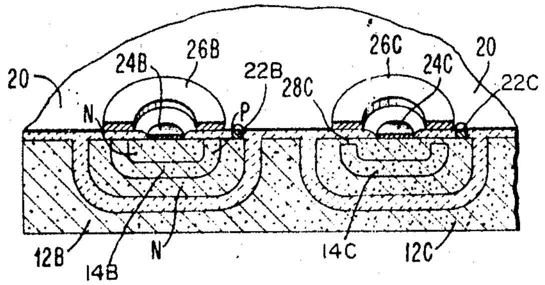
FIG. 5 is a perspective view partially in cross section of both on and off field effect transistors in one semiconductor wafer.

Referring to FIG. 5, normally off and normally on field effect transistor devices are shown as being part of the same seimconductor wafer. The corresponding reference numerals used in FIG. 1 are repeated for FIG. 5 with the addition of the letter B for the normally off field effect transistor device and the letter C for the normally on field effect transistor device. Conductive channel 28C in the normally on field effect transistor device is the same as the conductive channel 28 of FIG. 2. Isolation means 30 in the form of an isolation wall of electrically insulating material such as $SiO_2$, glass, etc. serve to electrically separate the normally off field effect transistor device from the normally on field effect transistor device. The above identified V. Y. Doo and J. Regh patent application indicates the use and formation of similar isolation means.

Figure 6:
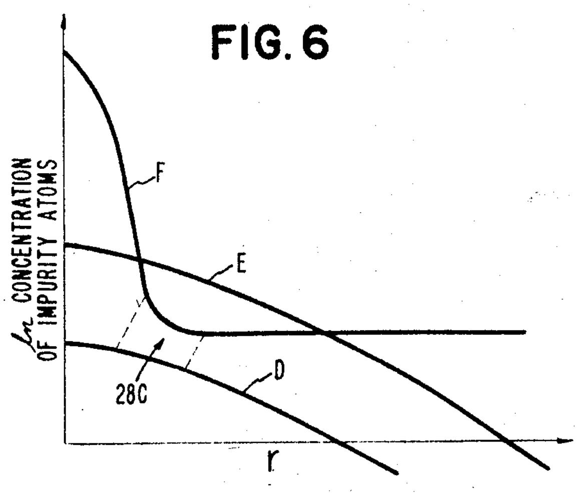
FIG. 6 is a graph similar to FIGS. 3 and 4 showing the varying concentrations of boron and phosphorous impurity atoms for the on and off field effect transistors of FIG. 5.

FIG. 6 is a graph similar to the graps of FIGS. 3 and 4 showing the relative concentration of both types of impurities in both the normally on and normally off field effect transistor devices of FIG. 5. In fabricating the normally on and normally off field effect transistor devices of FIG. 5, openings or windows are formed in the insulating layer of the semiconductor wafer and boron impurity atoms are diffused into the wafer to form the region 14B. Subsequently, a second set of openings or windows are opened up in the insulating layer and a second boron diffusion operation is carried out. Since the first set of openings or windows are still open, a greater total quantity of boron impurity atoms is diffused through these first set of openings to a greater depth in the semiconductor wafer than the depth of diffusion of the boron atoms in the second set of openings. Subsequently, phosphorous impurity atoms are diffused through both the first and second set of openings with the result that the first set of openings designates the location of normally off field effect transistor devices and the second set of openings designates the location of normally on field effect transistor devices. Preferably, if desired, the normally on devices can be formed adjacent to the normally off devices by having the first set of openings alternated with the second set of openings.

Curve D of FIG. 6 depicts the concentration of boron atoms in the semiconductor wafer beneath the second set of openings. Curve E depicts the quantity of boron atoms in the semiconductor wafer beneath the first set of openings. As is evident from FIG. 6, the quantity of boron atoms is greater beneath the first set of openings than beneath the second set of openings. Curve F depicts the phosphorous diffusion operation and it can be seen that numeral 28C depicts the channel formed in the normally on field effect transistors after reoxidation or heat treatment of the gate electrode.

Figure 7:
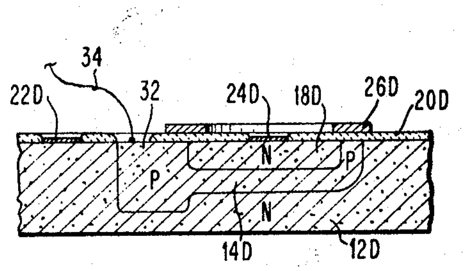
FIG. 7 is a perspective view partially in cross section showing a combined field effect and conventional transistor in one semiconductor device.

FIG. 7 depicts a semiconductor device arrangement which has been formed substantially in the same manner as the device of FIG. 1. Accordingly, corresponding reference numerals are used in FIG. 7 with the addition of the letter D. In certain instances it may be desirable to operate the field effect device as a conventional transistor which is permitted by the arrangement of FIG. 7. An opening is preferably first formed in the oxide layer so that a separate boron diffusion forms an extension portion 32 of the same conductivity type as the cup-shaped region 14. The opening is closed by oxidation before both the boron and phosphorous diffusion operations through another window as described above. The extension portion 32 may not be very large but can take the form of a substantially circular region that extends into contact with the cup-shaped region 14. Consequently, an ohmic contact 34 can be provided to the extension portion 32 so as to provide a base contact. If it should be desired to operate the transistor of FIG. 7 as a conventional transistor, the electrode 24D is used as an emitter contact and the other electrode 22D as a collector contact.

Figure 8:
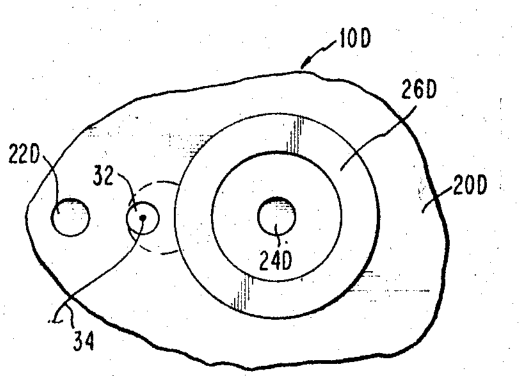
FIG. 8 is a top view of FIG. 7 showing both the gate electrode and the ohmic contact to the base region of the semiconductor device.

FIG. 8 shows a top view of the contact to the portion 32 and the toroidal configuration of the electrode 26D. If desired, electrical contact can be made to the central region 18 by extending the ohmic contact thereto in the form of a land through a small gap in the gate electrode. Beneath the gap in the gate electrode would be a region similar to region 32 of FIG. 7 thereby providing a region that is so heavily doped with boron that no channel can be formed across it. This technique permits other channel configurations beside the toroidal configuration of FIG. 7.

The specific description of this invention has been written with silicon as semiconductor material, but it should be evident to those skilled in the art that other semiconductor materials and other impurity atoms can be used as desired.

While this invention has been particularly shown and described with reference to the preferred embodiments thereof, it will be understood by those skilled in the art that the foregoing and other changes in form and details may be made therein without departing from the spirit and scope of the invention.

What is claimed is:

1. A field effect transistor comprising, in combination:
 - a first region of semiconductor material of one conductivity type;
 - a second region of semiconductor material of the same type conductivity as the conductivity type of said first region;
 - a single substantially cup-shaped region only of semiconductor material of the opposite type conductivity from said one conductivity type of said first and second regions and located between said first and second regions and forming at least one PN junction therewith, said cup-shaped region of semiconductor material having a portion extending toward the semiconductor surface;
 - first and second electrodes respectively connected to said first and second regions; and
 - a control electrode electrically insulated from the semiconductor surface positioned substantially over the entire portion of said cup-shaped region extending toward the semiconductor surface.

2. A field effect transistor comprising, in combination:
 - a first region of semiconductor material of one conductivity type;
 - a second region of semiconductor material of the same type conductivity as the conductivity type of said first region;
 - a single substantially cup-shaped region only of semiconductor material of the opposite type conductivity from said one conductivity type of said first and second regions and located between said first and second regions and forming at least one PN junction threwith, said cup-shaped region of semiconductor material having a portion extending toward the semiconductor surface;
 - a channel of semiconductor material of the same conductivity type as said one conductivity type extending between said first and second regions at the semiconductor surface across said portion of said cup-shaped region extending toward the semiconductor surface;
 - first and second electrodes respectively connected to said first and second regions; and
 - a control electrode electrically insulated from the semiconductor surface positioned substantially over the entire portion of said cup-shaped region extending toward the semiconductor surface.

3. A field effect transistor comprising, in combination:
 - a wafer of silicom semiconductor material having a first region of N type conductivity;
 - a second region of N type conductivity located at the surface of said wafer;
 - a single substantially cup-shaped region only of the P type conductivity located between said first and second regions and forming at least one PN junction therewith, said cup-shaped region having a portion extending toward the semiconductor surface;
 - first and second electrodes respectively connected to said first and second regions; and
 - a control electrode electrically insulated from the semiconductor surface positioned substantially over the entire portion of said cup-shaped region extending toward the semiconductor surface.

4. A field effect transistor comprising, in combination:
 - a wafer of silicon semiconductor material having a first region of N type conductivity;
 - a second region of N type conductivity located at the surface of said wafer;
 - a single substantially cup-shaped region only of the P type conductivity located between said first and second regions and forming at least one PN junction therewith said cup-shaped region having a portion extending toward the semiconductor surface;
 - a channel of semiconductor material of N type conductivity extending between said first and second regions at the semiconductor surface across said portion of said cup-shaped region extending toward the semiconductor surface;
 - first and second electrodes respectively connected to said first and second regions; and
 - a control electrode electrically insulated from the semiconductor surface positioned substantially over the entire portion of said cup-shaped region extending toward the semiconductor surface.

5. A semiconductor device arrangement comprising, in combination:
 - a first region of semiconductor material of one conductvity type;
 - a second region of semiconductor material of the same type conductivity as the conductivity type of said first region;
 - a single substantially cup-shaped region only of semiconductor material of the opposite type conductivity from said one conductivity type of said first and second regions and located between said first and second regions and forming at least one PN junction therewith, said cup-shaped region of semiconductor material having a portion extending toward the semiconductor surface;
 - first, second and third electrodes respectively connected to said first, second and cup-shaped regions; and
 - a control electrode electrically insulated from the semiconductor surface positioned substantially over the entire portion of said cup-shaped region extending toward the semiconductor surface.

6. A semiconductor device arrangement in accordance with claim 5, in which said first and second regions being of N type silicon, said cup-shaped region being of P type silicon, and an extension region of P type silicon connected to said cup-shaped region only of sufficient size for said third electrode to be connected thereto.

7. A semiconductor device arrangement in accordance with claim 6, in which said third electrode being a base contact, said second electrode being an emitter contact, and said first electrode being a collector contact, said second region being located at the semiconductor surface.

8. A semiconductor device arrangement comprising, in combination:
 - a semiconductor wafer having at least one normally off field effect transistor comprising a first region of semiconductor material of one conductivity type,
 - a second region of semiconductor material of the same type conductivity as the conductivity type of said first region,
 - a substantially cup-shaped region of semiconductor material of the opposite type conductivity from said one conductivity type of said first and second regions and located between said first and second regions and forming at least one PN junction therewith, said cup-shaped region of semiconductor material having a portion extending toward the semiconductor surface,
 - first and second electrodes respectively connected to said first and second regions, and
 - a control electrode electrically insulated from the semiconductor surface positioned substantially over the entire portion of said cup-shaped region extending toward the semiconductor surface; and at least one normally on field effect transistor electrically separated from said normally off field effect transistor, said normally on field effect transistor comprising a first region of semiconductor material of one conductivity type, a second region of semiconductor material of the same type conductivity as the conductivity type of said first region, a substantially cup-shaped region of semiconductor material of the opposite type conductivity from said one conductivity type of said first and second regions and located between said first and second regions and forming at least one PN junction therewith, said cup-shaped region of semiconductor material having a portion extending toward the semiconductor surface, a channel of semiconductor material of the same conductivity type as said one conductivity type extending between said first and second regions at the semiconductor surface across said portion of said cup-shaped region extending toward the semiconductor surface, first and second electrodes respectively connected to said first and second regions, and a control electrode electrically insulated from the semiconductor surface positioned substantially over the entire portion of said cup-shaped region extending toward the semiconductor surface.

References Cited

UNITED STATES PATENTS

| | | | |
|---|---|---|---|
| 3,204,160 | 8/1965 | Chih-Tang Sah | 317—235 |
| 3,345,216 | 10/1967 | Rogers | 148—1.5 |
| 3,212,162 | 10/1965 | Moore | 29—25.3 |
| 3,305,913 | 2/1967 | Loro | 29—25.3 |

JAMES W. LAWRENCE, Primary Examiner

R. SANDLER, Assistant Examiner

U.S. Cl. X.R.

29—571